United States Patent [19]
Furutatsu et al.

[11] Patent Number: 5,707,714
[45] Date of Patent: Jan. 13, 1998

[54] PRINTED CIRCUIT BOARD FOR FLOW SOLDERING

[75] Inventors: Tetsuya Furutatsu; Yuichi Nagase; Seiji Shioiri, all of Gunma-ken, Japan

[73] Assignee: Mitsuba Corporation, Kiryu, Japan

[21] Appl. No.: 712,613

[22] Filed: Sep. 13, 1996

[51] Int. Cl.⁶ .................. B32B 3/00; H05K 5/00; H05K 1/14; H05K 7/10

[52] U.S. Cl. .................. 428/209; 428/901; 361/679; 361/743; 361/767; 361/808; 174/250; 174/261

[58] Field of Search .................. 361/743, 767, 361/772, 808, 679; 428/209, 901; 174/261, 250

[56] References Cited

U.S. PATENT DOCUMENTS

| | | | |
|---|---|---|---|
| 5,256,464 | 10/1993 | Hecht | 428/901 |
| 5,453,882 | 9/1995 | Amano et al. | 174/261 |
| 5,493,075 | 2/1996 | Chong et al. | 174/261 |
| 5,541,367 | 7/1996 | Swamy | 361/808 |

*Primary Examiner*—Cathy F. Lam
*Attorney, Agent, or Firm*—Marshall & Melhorn

[57] ABSTRACT

An improved printed circuit board which can reduce or eliminate unsatisfactory soldering caused by trapped gas in surface mounting electronic components by flow soldering is disclosed. According to the invention, the printed circuit board comprises an electrically conductive pattern having a plurality of connection pads to which leads of electronic components are to be connected; and a solder resist layer formed over said electrically conductive pattern and having a plurality of windows which expose said connection pads, wherein at least one of said windows has an extension exposing an additional part of said pad, said extension being substantially narrower than said window. The extension allows the additionally exposed part of the pad to contact with the solder even when the associated pad is almost entirely covered by the trapped gas, so that the solder is pulled to the pad and spread over the pad. Because the extension require a small area, it is effective even when the components are mounted at a high density.

4 Claims, 4 Drawing Sheets

(A)

(B)

PRINTED CIRCUIT BOARD FOR FLOW SOLDERING

TECHNICAL FIELD

The present invention relates to a printed circuit board for surface mounting electronic component parts such as chip components and mini-mold semiconductor devices thereto by flow soldering.

BACKGROUND OF THE INVENTION

Flow soldering technique has been commonly used in mounting electronic components to a printed circuit board. According to this technique, the electronic components are temporarily attached to one side of the printed circuit board by using a bonding agent before soldering. Then, with the side carrying the components facing down, the printed circuit board is moved in a substantially horizontal direction immediately over the top of a tub which is filled with molten solder. Typically, the solder in the tub is made to flow upward and is allowed to continually flow over the brim of the tub, and the liquid surface of the solder defines a convex surface. Thus, as the printed circuit board passes along over the tub, the solder attaches to prescribed locations on the printed circuit board.

According to this flow soldering process, gases such as air and flux gas tend to be trapped in nooks and corners defined around the components carried by the printed circuit board. In the case of an insertion mounted printed circuit board, the gas can escape from the holes in the printed circuit board, but they cannot so readily escape in the case of a surface mounted printed circuit board. In particular, the gas has a tendency to be trapped on the leading end and the trailing end of each electronic component. Such trapped gases could cover connection pads of the circuit board and prevent proper attachment of the solder to the connection pads and become a major cause of unsatisfactory soldering results. This problem is particularly pronounced when tall components are mounted. Although the problem could be solved by using larger connection pads, it could result in unintended solder bridges between adjacent pads when the connection pads are arranged close to one another for the purpose of mounting component parts at a high density.

BRIEF SUMMARY OF THE INVENTION

In view of such problems of the prior art, a primary object of the present invention is to provide an improved printed circuit board suitable for surface mounting electronic components by flow soldering which can reduce or eliminate unsatisfactory soldering results, that may be caused by trapped gases, even when the electronic components are mounted at a high density.

A second object of the present invention is to provide an improved printed circuit board suitable for surface mounting electronic components by flow soldering which can ensure satisfactory soldering results at all times with a minimum modification from the conventional arrangement.

According to the present invention, the above objects can be achieved by providing a printed circuit board suitable for surface mounting electronic components by flow soldering, comprising: an insulating base board; an electrically conductive pattern formed on said base board, said electrically conductive layer comprising a plurality of connection pads to which leads of said components are to be connected; and a solder resist layer formed over said electrically conductive pattern, said solder resist layer having a plurality of windows which expose said connection pads, wherein at least one of said windows has an extension exposing an additional part of an associated connection pad, said extension being substantially narrower than said window.

In this way, even when the connection pad is almost entirely covered by trapped gas during the flow soldering process, the extension of the window in the solder resist layer allows the additionally exposed part of the connection pad to contact the molten solder. Once the additionally exposed part contacts the molten solder, the solder is pulled toward the pad and drives the gas off the pad, so that the solder can spread over the pad. Because the wetting of the pad with the solder begins from the narrow additionally exposed part, the solder can effectively propagate to the entire surface of the pad in the manner of a wedge, and drive the gas off the pad.

Since the extensions require only a small additional area, the interference between adjacent pads can be minimized, and it is still possible to mount component parts at a high density. Also, the shapes, locations and directions of the extensions can be freely selected so that their presence normally would not require any modification to the existing circuit board design. It is thus possible to avoid bridging of solder between adjacent connection pads by suitably selecting the size and shape of each extension even when a high density mounting of component parts is required.

In one preferred embodiment of the present invention, the extension of the window extends away from an adjacent electronic component. The leading end and the trailing end of a tall component part with respect to the relative flow direction of the molten solder are the parts which are most prone to trap a volume of gas. Therefore, it is advantageous to extend the extension away from such an adjacent component in either upstream or downstream direction with respect to the relative flow direction of the molten solder so that the chance of the extension staying clear of such a volume of gas may be increased.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
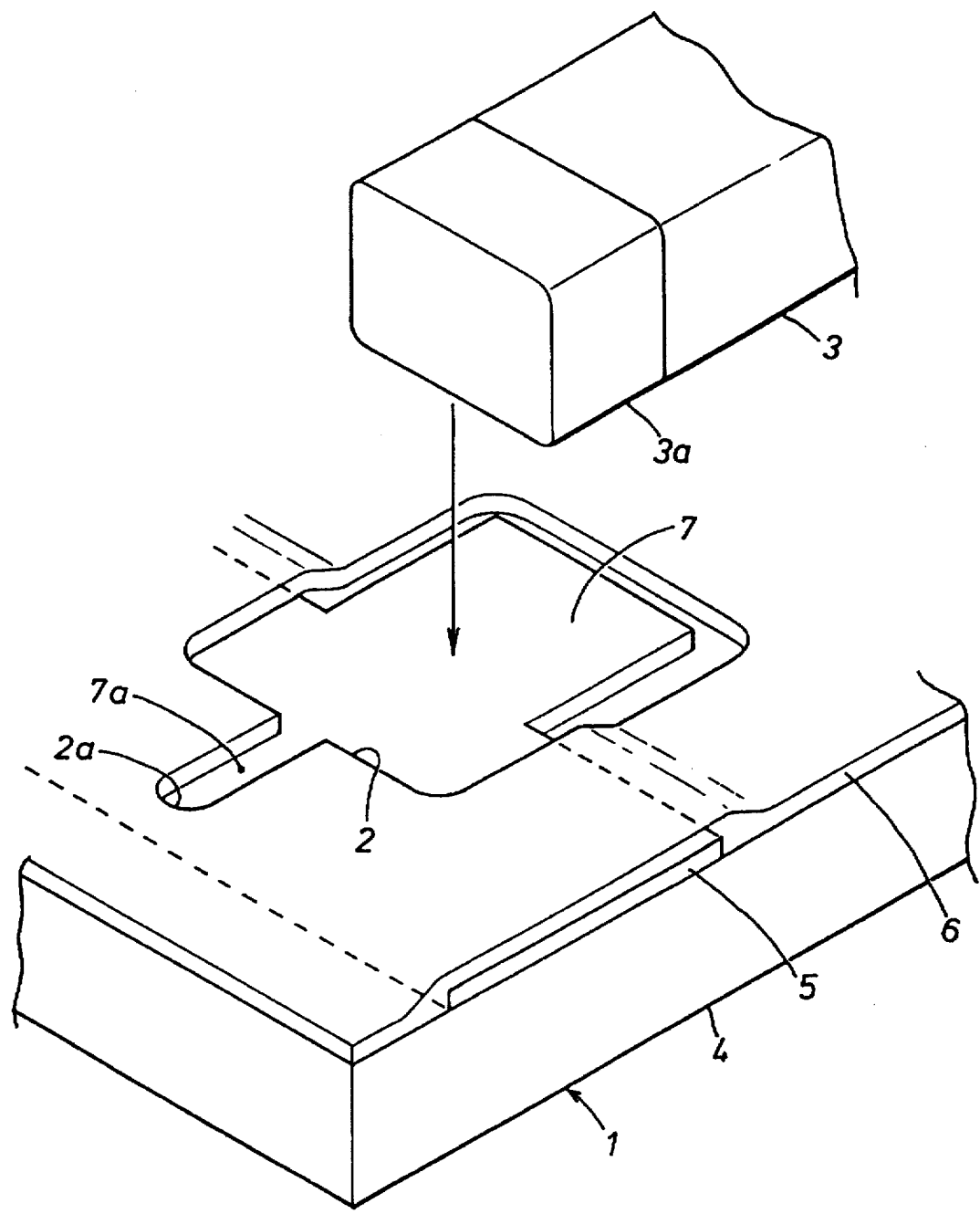
FIG. 1 is a fragmentary perspective view showing a printed circuit board according to the present invention.

FIG. 1 shows a fragmentary perspective view of a printed circuit board of the present invention. The printed circuit board 1 comprises an insulating base board 4, an electrically conductive pattern 5, which is made of an electrically conductive material such as copper, formed on one side of the base board 4. The electrically conductive pattern 5 includes a plurality of connection pads such as a pad 7 to which a lead 3a of a chip component 3 is to be connected by soldering. A solder resist layer 6 is placed over the surface of the printed circuit board 1 so as to overlie the electrically conductive pattern 5, and the solder resist layer 6 is provided with windows such as a window 2 exposing the connection pads and other parts to which the solder is intended to be attached. In the embodiment shown in FIG. 1, the window 2 associated with the connection pad 7 has an extension 2a, which has a narrow straight shape in this embodiment, to expose an additional part 7a of the connection pad 7.

Figure 2:
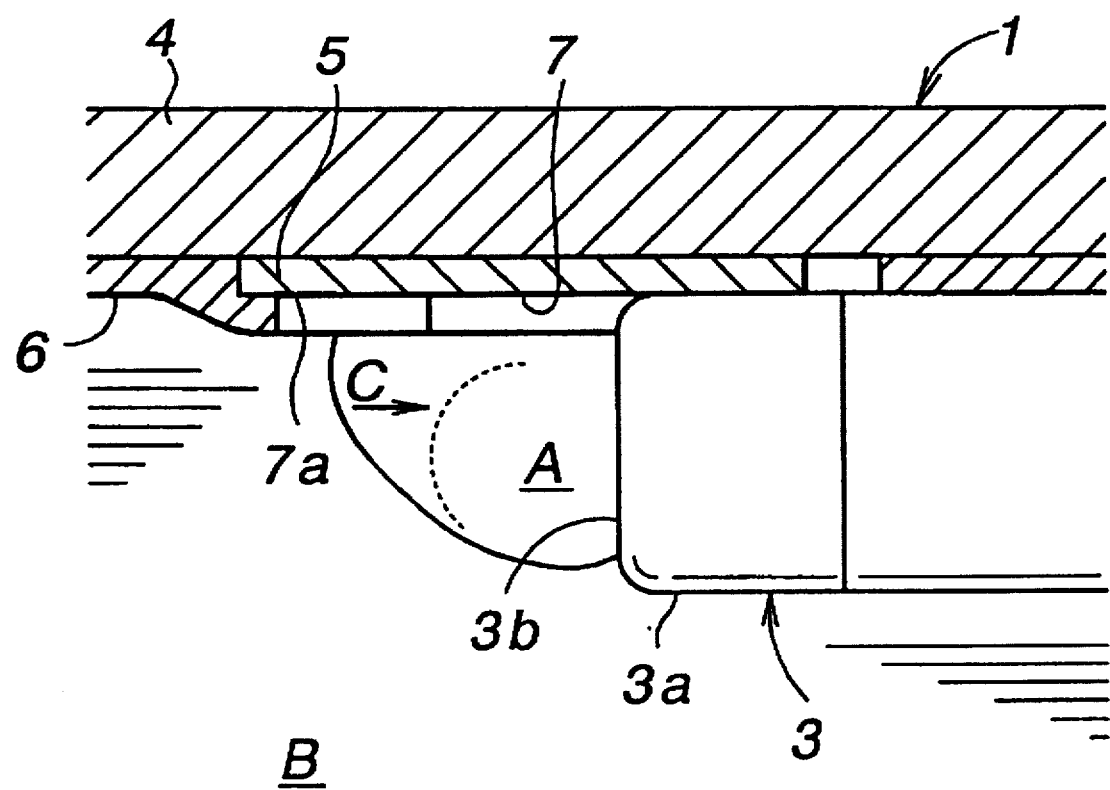
FIG. 2 is a sectional elevation view of a part of the printed circuit board of FIG. 1 during the soldering process.
Figure 3:
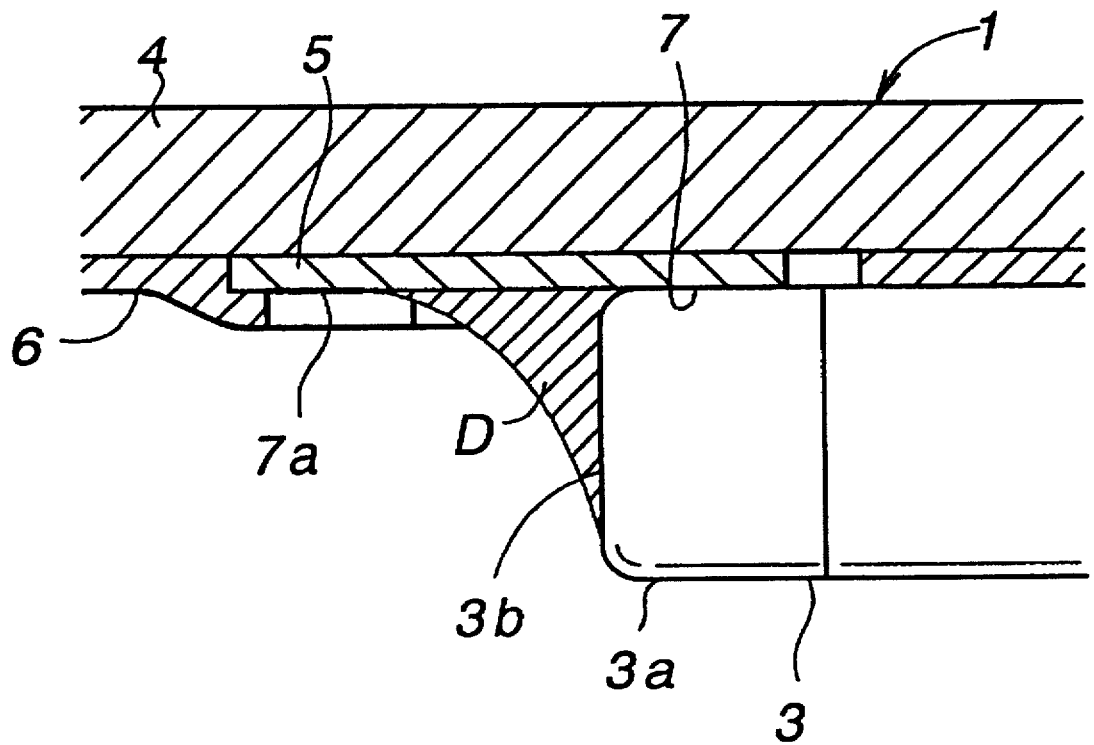
FIG. 3 is a view similar to FIG. 2 showing the printed circuit board after the soldering process.

Prior to the soldering process, initially, the component 3 is temporarily attached to the printed circuit board 1 by using a bonding agent with the lead 3a properly aligned with the pad 7. Then, with the side carrying the component 3 facing down, the printed circuit board 1 is moved in a substantially horizontal direction immediately over the top of a tub which is filled with molten solder B in a conventional manner. During this process, conventionally, there was a tendency for air and/or flux gas to be trapped in corners defined by adjacent tall component parts. However, according to the present invention, even if a volume of gas A may be temporarily trapped on an end surface 3b of the component 3, as shown in FIG. 2, the additionally exposed part 7a of the connection pad 7 can contact the molten solder B and pull the solder toward the pad 7 as shown by the arrow C in FIG. 2. The solder, in turn, drives the volume of gas A off the connection pad 7, allowing the solder to spread over the entire surface of the pad 7. As a result, as shown in FIG. 3, the lead 3a and the connection pad 7 are connected solidly by the thus formed lump of solder D involving no void therein.

The placement of the extensions should be determined according to various factors. The leading end and the trailing end of a tall component part with respect to the relative flow direction of the molten solder are the parts which are most prone to trap a volume of gas. Therefore, it is advantageous to extend the extension away from such an adjacent component in either upstream or downstream direction with respect to the relative flow direction of the molten solder so that the chance of the extension staying clear of such a volume of gas may be increased. The shape, length, width and direction of each window extension can be freely determined according to the size of the volume of gas which may be related to the size and height of the adjacent component part.

Figure 4:
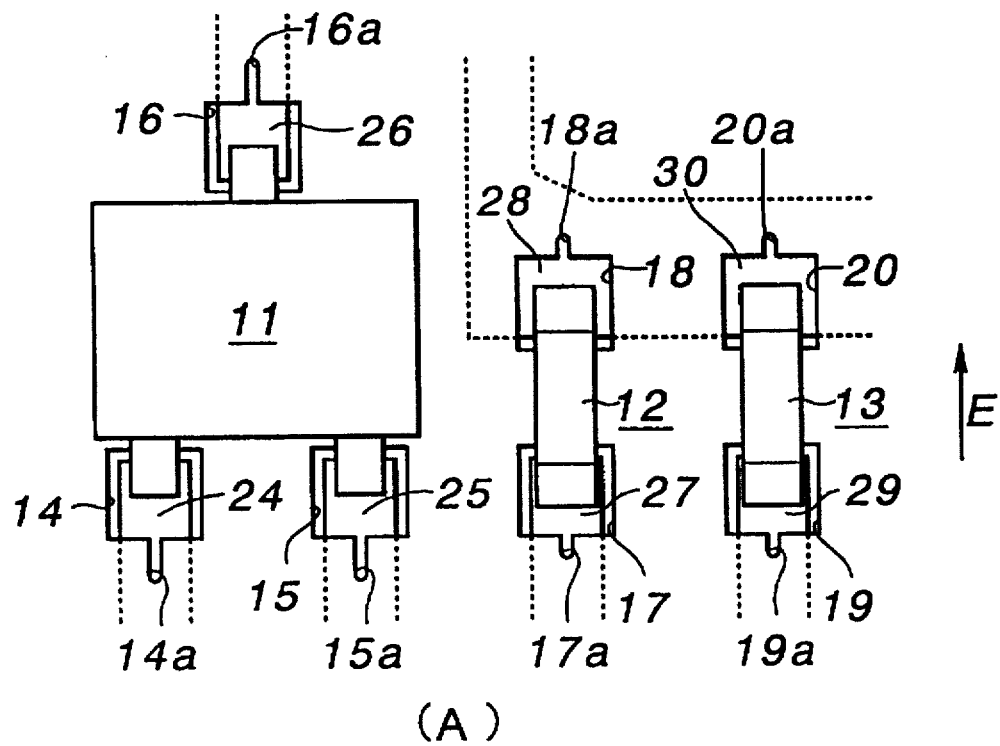
FIGS. 4A and 4B are plan views illustrating possible arrangements of the extensions of the windows in relation with the flow directions of the solder.
Figure 4:
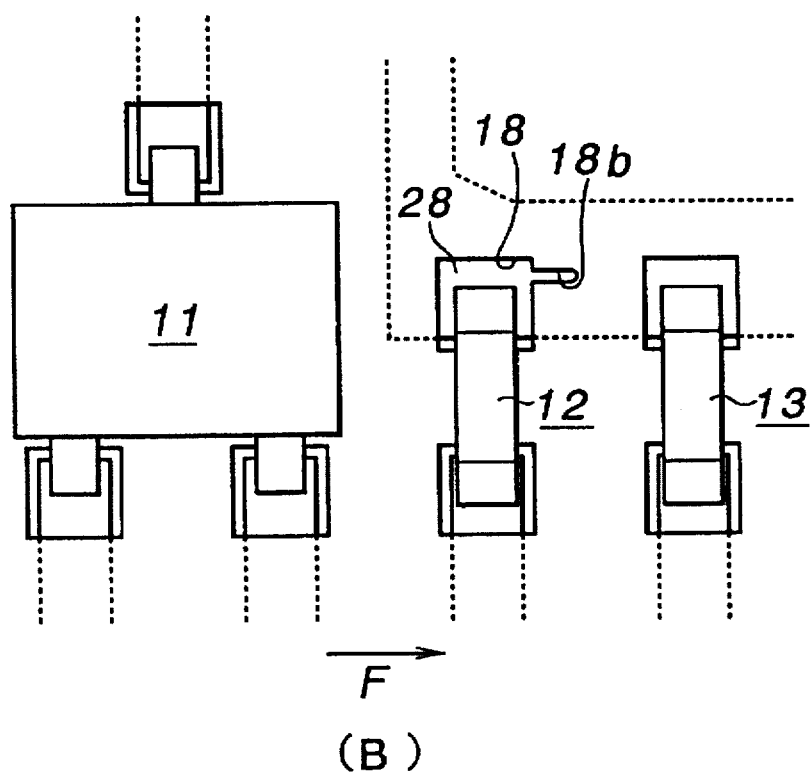

FIG. 4A shows one example of the arrangement of the window extensions. In FIG. 4A, connection pads 24 to 30 for attaching a three-terminal mini mold device 11 and chip components 12 and 13 are exposed by windows 14 to 20, respectively. The molten solder flows relative to the pads as indicated by the arrow E. As all of the pads are located immediately either upstream or downstream of relatively tall component parts, volumes of air are likely trapped on all of the pads. Accordingly, the windows 14, 15, 17 and 19 which are located upstream of the components are provided with extensions 14a, 15a, 17a and 19a, respectively, each of which extends in the upstream direction. Similarly, the windows 16, 18 and 20 which are located downstream of the components are provided with extensions 16a, 18a and 20a, respectively, each of which extends in the downstream direction.

FIG. 4B shows another example of the arrangement of the window extensions. In FIG. 4B, the molten solder flows relative to the pads as indicated by the arrow F. In this example, only the window 18 is provided with an extension 18b, because the associated pad 28, which is located immediately downstream of the mini mold device 11, is the only pad on which air or flux gas is likely to be trapped.

Although the extension of each window has been shown as having a straight narrow shape in the above description, it is not intended to limit the present invention to the particular embodiment. It will be understood for those skilled in the art that the extension may be of any shape, such as a curved shape or a triangle, as long as the additional part of the pad exposed by the extension can effectively contact with the solder, while avoiding unintended solder bridges between adjacent connection pads.

What we claim is:

1. A printed circuit board suitable for surface mounting electronic components by flow soldering, comprising:
   an insulating base board;
   an electrically conductive pattern formed on said base board, said electrically conductive layer comprising a plurality of connection pads to which leads of said components are to be connected; and
   a solder resist layer formed over said electrically conductive pattern, said solder resist layer having a plurality of windows which expose said connection pads,
   wherein at least one of said windows has an extension exposing an additional part of an associated connection pad, said extension being substantially narrower than said window.

2. A printed circuit board according to claim 1, wherein said extension of said window extends away from an adjacent electronic component.

3. A printed circuit board according to claim 2, wherein said extension of said window extends in an upstream direction with respect to a flow direction of solder relative to said printed circuit board.

4. A printed circuit board according to claim 2, wherein said extension of said window extends in a downstream direction with respect to a flow direction of solder relative to said printed circuit board.

* * * * *